(12) United States Patent
Cho et al.

(10) Patent No.: US 11,204,369 B2
(45) Date of Patent: Dec. 21, 2021

(54) SEMICONDUCTOR DEVICE TEST SOCKET

(71) Applicant: MICRO FRIEND CO., LTD, Seoul (KR)

(72) Inventors: Yong Ho Cho, Yongin-si Gyeonggi-do (KR); Jong Myeon Lee, Gwacheon-si (KR); Tae Kyun Kim, Seoul (KR)

(73) Assignee: MICRO FRIEND CO., LTD, Seoul (KR)

( * ) Notice: Subject to any disclaimer, the term of this patent is extended or adjusted under 35 U.S.C. 154(b) by 0 days.

(21) Appl. No.: 17/053,218

(22) PCT Filed: Oct. 23, 2018

(86) PCT No.: PCT/KR2018/012540
§ 371 (c)(1),
(2) Date: Nov. 5, 2020

(87) PCT Pub. No.: WO2019/216503
PCT Pub. Date: Nov. 14, 2019

(65) Prior Publication Data
US 2021/0285984 A1 Sep. 16, 2021

(30) Foreign Application Priority Data
May 11, 2018 (KR) .......................... 10-2018-0054247

(51) Int. Cl.
*G01R 1/04* (2006.01)
*G01R 1/073* (2006.01)

(52) U.S. Cl.
CPC ....... *G01R 1/0466* (2013.01); *G01R 1/07307* (2013.01)

(58) Field of Classification Search
CPC ........................... F01R 1/0466; F01R 1/07307
See application file for complete search history.

(56) References Cited

U.S. PATENT DOCUMENTS 6,551,126 B1* 4/2003 Feldman ............ G01R 1/06772
324/755.05
2005/0184748 A1* 8/2005 Chen .................. G01R 1/06738
324/755.05

FOREIGN PATENT DOCUMENTS

KR 10-2009-0082783 A 7/2009
KR 10-2010-0037431 A 4/2010
(Continued)

OTHER PUBLICATIONS

English Translation of PCT/KR2018/012540 (Year: 2019).*
(Continued)

*Primary Examiner* — Paresh Patel
(74) *Attorney, Agent, or Firm* — Novick, Kim & Lee, PLLC; Jae Youn Kim

(57) ABSTRACT

A semiconductor device test socket has a shielding structure formed around each contactor so as to prevent signal delay or distortion during a test process and thereby enhance the test reliability. The socket includes a vertical probe comprising a contactor which has a contact terminal to be electrically connected to an external connection terminal of a semiconductor device. The shielding structure which is formed by laminating a conductive material on the outer edge of the contactor and is electrically connected to a ground. The socket further includes an elastic layer which is filled in the space between the contactor and the shielding structure, and surrounds the contactor such that the contact terminal of the contactor is exposed; and a connection film which is formed by laminating a conductive material so as to electrically connect shielding structures of multiple vertical probes.

20 Claims, 10 Drawing Sheets

(56) References Cited

FOREIGN PATENT DOCUMENTS

| | | |
|---|---|---|
| KR | 10-2011-0101986 A | 9/2011 |
| KR | 10-1126690 B1 | 4/2012 |
| KR | 10-1535179 B1 | 7/2015 |

OTHER PUBLICATIONS

"Optimization Design and Analysis of Polyimide Multilayer Test Interposer for BGA Socket with 3D MEMS Probe Contact" by Kim et al. Mar. 4-7, 2018 (26 pages) (Year: 2018).*

* cited by examiner

SEMICONDUCTOR DEVICE TEST SOCKET

CROSS-REFERENCE TO RELATED APPLICATIONS

This application is a national stage entry under 35 USC 371 of PCT/KR2018/012540, filed Oct. 23, 2018, which claims priority to KR10-2018-0054247, filed May 11, 2018, the disclosure of which is incorporated by reference herein in its entirety.

STATEMENT REGARDING PRIOR DISCLOSURES BY THE INVENTORS

It is advised that the claimed invention was disclosed at Burn-in & Test Strategies Workshop, on Mar. 4, 2018, in a presentation entitled "Optimization Design and Analysis of Polyimide Multilayer Test Interposer for BGA socket with 3D MEMS Probe Contact" (KIM, Tae-Kyun et al.) and "Development of Co-axial Test Socket of 3D MEMS Technologies" (LEE, Jongmyeon et al.) by the inventor, joint inventor or another who obtained the subject matter disclosed directly or indirectly from the inventors or joint inventors, and thus KIM, Tae-Kyun et al. and LEE, Jong-myeon et al. are not prior art to the claimed invention under 35 USC 102(b)(1) as exceptions.

TECHNICAL FIELD

The present invention relates to a semiconductor device test socket, and more specifically, to a semiconductor device test socket in which a shielding structure is formed around each contactor and thus signal delay or distortion during a test process is prevented to enhance the test reliability

BACKGROUND ART

Generally, an integrated circuit (IC) chip performs various processing functions, and an input/output terminal is provided in plurality to perform these processing functions. Accordingly, the integrated circuit chip is formed in a ball grid array (BGA) package type or the like, and the BGA package type has a plurality of electrode terminals formed at regular intervals in lateral and longitudinal directions on a lower surface of the package, and the electrode terminals are each composed in a ball shape for electrical or mechanical contact with printed circuit boards.

These integrated circuit chip devices undergo an electrical characteristic test and a burn-in test to confirm reliability of products before shipment, and test sockets are required for these tests. Here, the electrical characteristic test is provided to test electrical characteristics such as an input/output characteristic, a pulse characteristic, a processing performance characteristic, noise tolerance, and the like by connecting all input and output terminals of the integrated circuit to a predetermined test signal generating circuit. The burn-in test is provided to test whether a defect occurs for a certain period of time by applying a voltage higher than a rated voltage to the integrated circuit chip devices which has passed through the electrical characteristic test at a temperature higher than a normal operating environment.

Conventionally, the test process is performed using a pogo pin type test socket, but a contact failure can occur between a ball terminal of a semiconductor device and a pogo pin, and since a ball terminal of a BGA type device package comes into abnormal contact with a probe in a misaligned direction or with force, there is a problem in that the ball terminal or probe is easily damaged.

Further, in the conventional pogo pin type test socket, stable electrical characteristics such as a contact resistance, impedance, and the like of the probe should be maintained for precise function inspection of the semiconductor device, but the reliability of the test is difficult to secure due to an elastic error of each pogo pin and a defect of a gold plating film.

In addition, since there is a limit to reducing the pitch of the pogo pin due to a configuration of an exterior structure in which the pogo pin and an installation hole are formed, there is a limit to manufacturing of low-pitch, high-density test sockets which can follow a current trend of highly integrated and ultra-miniature semiconductor devices. In addition, since the number of ball terminals of the BGA type semiconductor device package increases to about 600 to 1000 or more and thus density increases, in the pogo pin type test socket, manufacturing and assembly of various components such as the pogo pin, the exterior structure, and the like are complicated and difficult, and thus the manufacturing cost significantly increases, and even when only a single pogo pin is defective during use in a real test, the pin should be replaced. Accordingly, there is a large problem in that the process is too difficult and time-consuming, and thus loss of equipment and personnel is enormous.

PRIOR ART DOCUMENTS

Korean Registered Patent No. 10-1126690 (published on Apr. 2, 2012) Korean Registered Patent No. 10-1535179 (published on Jul. 8, 2015)

DISCLOSURE

Technical Problem

The present invention is directed to providing a semiconductor device test socket capable of enhancing the test reliability by forming a shielding structure made of a conductive material around each contactor.

The present invention is also directed to providing a semiconductor device test socket that stably supports a contactor by filling and connecting an elastic layer in a space between a shielding structure and each contactor physically and electrically coming into contact with an electrode terminal of a semiconductor device.

Technical Solution

One aspect of the present invention provides a semiconductor device test socket including: a plurality of vertical probes each including a contactor having a contact terminal electrically connected to an external connection terminal of a semiconductor device, and a shielding structure which is formed by sequentially laminating a conductive material on an outer edge of the contactor in a coaxial structure using micro electro mechanical system (MEMS) technology and is electrically connected to a ground; a connection film which is formed by sequentially laminating a conductive material using MEMS technology to electrically connect the shielding structures of the plurality of vertical probes formed with a pitch corresponding to the external connection terminal of the semiconductor device; and an elastic layer which is filled in a space between the contactor and the shielding structure so that the contact terminal of the contactor is exposed after forming the contactor, the shielding structure, and the connection film, wherein the contactor includes a contact terminal, a connection pad formed at a position corresponding to the contact terminal, and a spiral-type buffer portion configured to connect the contact terminal and the connection pad, and the buffer portion includes at least one extending portion formed in a Z-axis direction using MEMS technology, and at least one connection beam formed to be bent in a spiral direction at an XY plane.

Further, the plurality of shielding structures may be formed in a coaxial structure of which a cross-section has a circular shape or a quadrangular shape.

In addition, the plurality of shielding structures may be formed to have a height which is the same as the contactor.

In addition, the plurality of shielding structures may be formed to be lower than a height of the contactor.

In addition, the plurality of shielding structures and the connection film may be made of nickel or a nickel-cobalt alloy as a conductive material.

In addition, an input part opened to inject a liquid elastic layer material may be formed in at least one shielding structure among the shielding structures of the plurality of vertical probes.

In addition, a pitch between the plurality of vertical probes may range from 500 to 1000 μm, a height of the contactor of each of the vertical probes may range from 450 to 700 μm, and a separation distance of the space formed between the contactor and the shielding structure may be smaller than 100 μm.

In addition, the buffer portion may include a first extending portion formed to a predetermined length in a Z-axis direction from a lower surface of the contact terminal, an eccentric extending portion which is eccentric from the first extending portion in the Z-axis direction and formed to a predetermined height, a first connection beam formed to be bent in a spiral direction at an XY plane so that one side is connected to a lower surface of the first extending portion and the other side is connected to an upper surface of the eccentric extending portion, a second extending portion formed to a predetermined height in the Z-axis direction from an upper surface of the connection pad, and a second connection beam formed to be bent in the spiral direction at the XY plane so that one side is connected to an upper surface of the second extending portion and the other side is connected to a lower surface of the eccentric extending portion.

In addition, a plurality of contact tips may be formed to protrude from an upper surface of the contact terminal, and each of the plurality of contact tips may have a circular cross-section and may be formed of a conductive material.

In addition, a material of the elastic layer may include any one of polydimethylsiloxane (PDMS), polyurethane (PU), polyurethane acrylate (PUA), silicone rubber, and polymethylmethacrylate (PMMA).

In addition, the plurality of vertical probes may be formed on a first surface of a base layer mounted on a test board electrically connected to semiconductor inspection equipment, and the base layer may be formed of polyimide (PI).

In addition, a plurality of external connection pads may be formed on a second surface of the base layer, a circuit pattern portion made of a conductive material may be formed in the base layer, and the plurality of external connection pads may electrically connect the circuit pattern portion and an electrode terminal of the test board.

In addition, the plurality of external connection pads may be formed at regular intervals.

In addition, the plurality of external connection pads may be formed at irregular intervals.

In addition, the circuit pattern portion may include a first circuit pattern formed in the base layer to be electrically connected to the external connection pad, a second circuit pattern having one end electrically connected to the first circuit pattern and the other end exposed on the base layer to be electrically connected to one of the vertical probe and the connection film, and a ground pattern.

In addition, the second circuit pattern and the ground pattern may be formed of nickel or a nickel-cobalt alloy.

In addition, a pitch between the one external connection pad and an external connection pad adjacent thereto may be formed larger than a pitch between the contactor and a contactor adjacent thereto.

In addition, an auxiliary connection film and a ground pattern may be formed in the first surface of the base layer to have a height the same as the connection film, and the auxiliary connection film may electrically connect the connection film and the ground pattern.

Further, the buffer portion may include one extending portion and one connection beam and may be formed as a single stage.

In addition, the buffer portion may include two extending portions and two connection beams and may be formed as a double stage.

Advantageous Effects

According to the present invention, it can be suitable for a high-speed test process for a high-frequency device using a plurality of contactors which are densely installed in response to a fine pitch, and it is possible to enhance the test reliability by forming a coaxial shielding structure with a conductive material on each contactor to restrain signal interference, noise, and distortion, and ensure signal integrity.

Further, in the present invention, since an elastic layer formed to surround each contactor is filled in a space between the contactor and the shielding structure, it is possible to enhance durability of the contactor by restraining shape deformation of the contactor due to a decrease in elasticity.

MODES OF THE INVENTION

Figure 1:
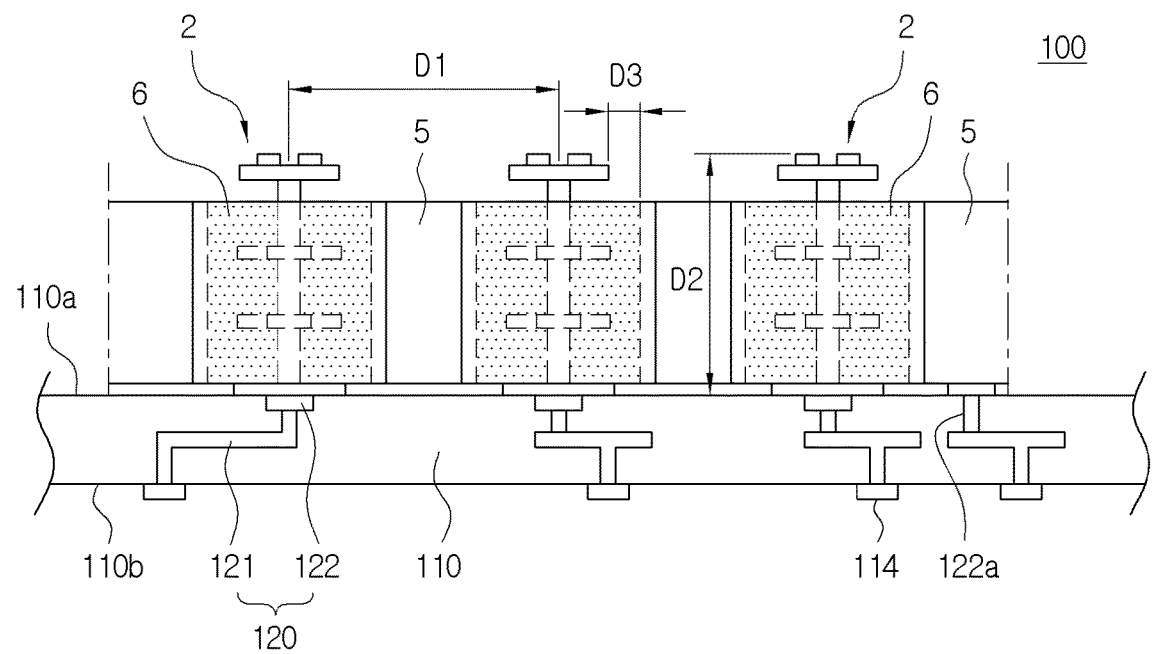
FIG. 1 is a cross-sectional view of a semiconductor device test socket according to an embodiment of the present invention.

Hereinafter, embodiments of the present invention will be described with reference to the accompanying drawings to describe the present invention. The same reference numeral shown in the drawings refers to the same member. Further, in a description of the present invention, when specific descriptions of a known function or configuration are determined to obscure the principle of the present invention, a detailed description will be omitted. Further, a case in which one part "includes" one component is not meant to preclude other components but to further include other components unless specifically stated otherwise.

Hereinafter, an embodiment according to the present invention will be described in detail with reference to the accompanying drawings.

Figure 2:
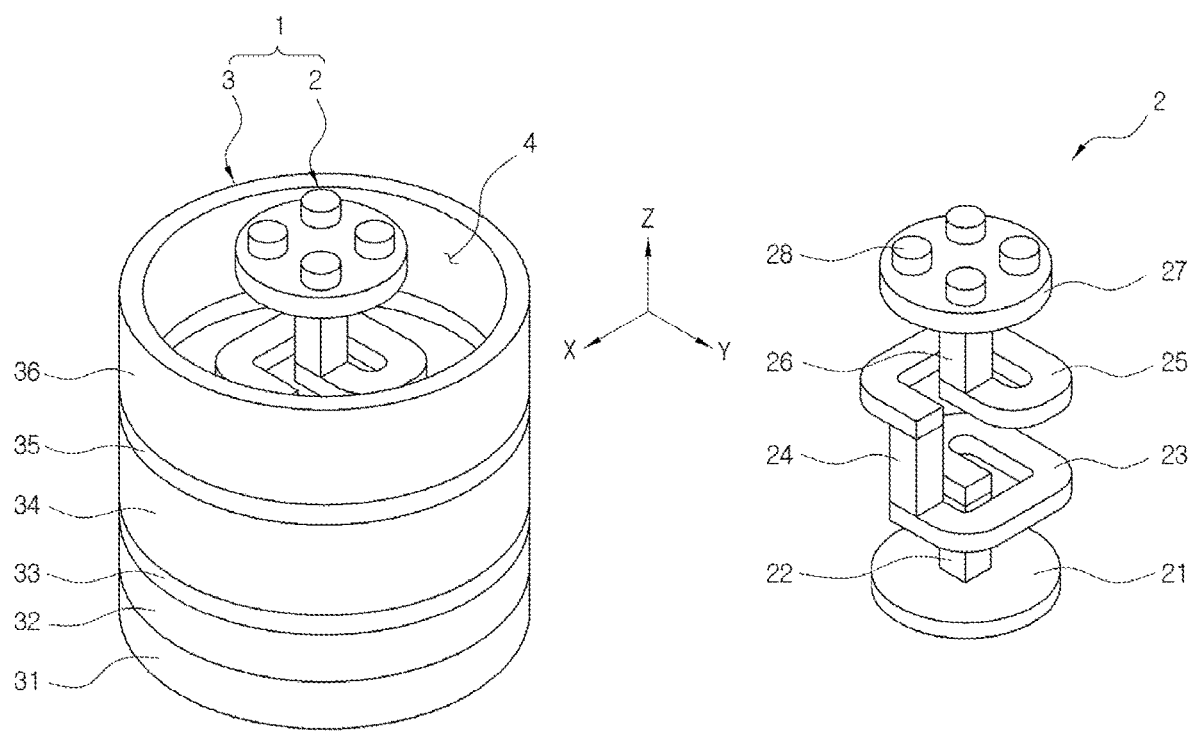
FIG. 2 is a perspective view for describing a structure of a vertical probe in FIG. 1.
Figure 3:
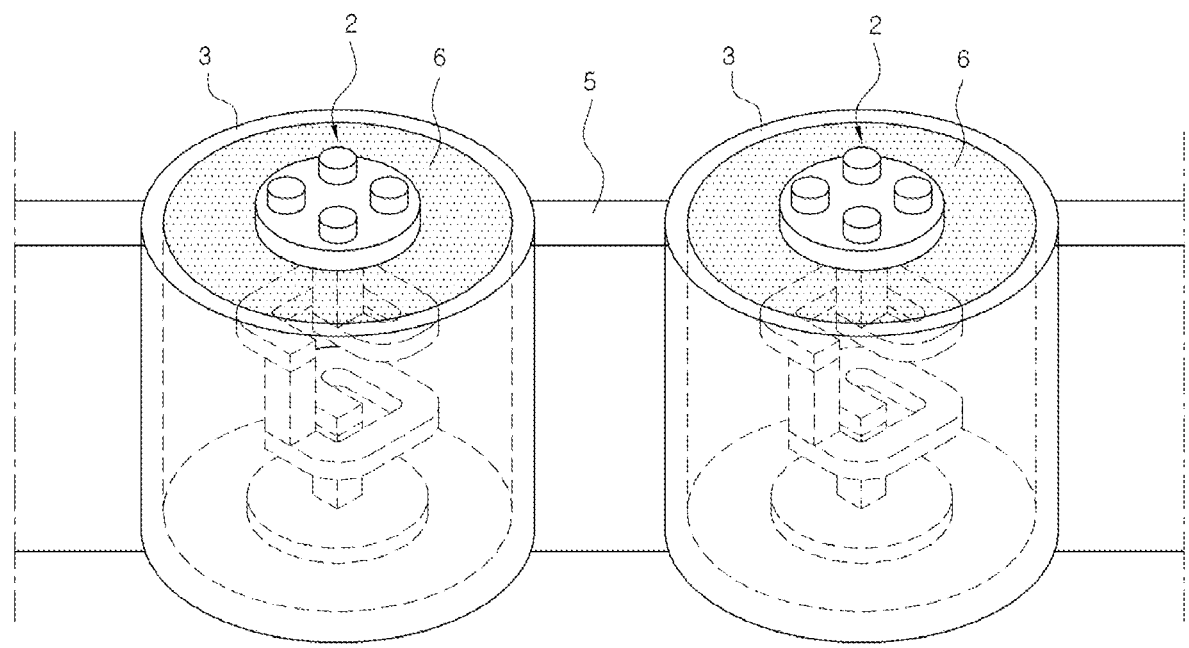
FIG. 3 is a perspective view for describing a structure of a connection film in FIG. 1.

As shown in FIGS. 1 to 3, a test socket 100 according to one embodiment of the present invention includes a base layer 110 mounted on a test board electrically connected to semiconductor inspection equipment, a circuit pattern portion 120 formed in the base layer 110, a plurality of vertical probes 1 formed on the base layer 110, a connection film 5, and an elastic layer 6 which elastically supports the vertical probes.

The base layer 110 is provided with a first surface 110a and a second surface 110b opposite to the first surface and may be formed in an approximately quadrangular shape in a plan view. The first surface 110a may be formed with the plurality of vertical probes 1, the connection film 5, and the elastic layer 6, and the second surface 110b may be seated on the test board (not shown).

The base layer 110 may be formed of, for example, a ceramic material or a polyimide (PI) material. When the base layer 110 is manufactured using a ceramic material, a manufacturing time of the base layer 110 may increase, and a cost burden may increase due to an expensive ceramic material. Accordingly, in one embodiment, the base layer 110 may be formed of a polyimide (PI) material, which exhibits almost similar performance to that of a ceramic material, while reducing manufacturing time and having a relatively inexpensive price. Polyimide (PI) refers to a generic term for a heat-resistant resin having an imide bond (—CO—NH—CO—) in a main chain, and the characteristics of the polyimide (PI) material are high heat resistance and, specifically, it has an advantage that the characteristics are not aged even when used for a long time at high temperature. Further, the ceramic material may have a different coefficient of thermal expansion from a semiconductor wafer, and accordingly, it is difficult to match the base layer 110 to the semiconductor wafer, but the polyimide (PI) material may overcome the above problems due to the high heat resistance.

A plurality of external connection pads 114 may be formed on the second surface 110b of the base layer 110. Each of the external connection pads 114 may be electrically connected to the circuit pattern portion 120 and electrode terminals of the test board. The external connection pads 114 may be disposed at regular or irregular intervals.

The plurality of circuit pattern portions 120 made of a conductive material may be formed in the base layer 110 using micro electro mechanical system (MEMS) technology. The circuit pattern portions 120 may be electrically connected to the vertical probe 1 and external connection terminals of the semiconductor device. The plurality of circuit pattern portions 120 may be formed at regular or irregular intervals.

Each of the circuit pattern portions 120 may include, for example, a first circuit pattern 121 formed in the base layer 110 and electrically connected to the external connection pad 114, a second circuit pattern 122 which has one end electrically connected to the first circuit pattern 121 and the other end exposed on the base layer 110 and thus is electrically connected to the vertical probe 1 and the connection film 5, and a ground pattern 122a.

The first circuit pattern 121 is rearranged so that an external connection terminal having a fine pitch in a semiconductor device is connected to an electrode terminal on a general-purpose test board. An arrangement shape, a position, and the like of the first circuit pattern 121 may be variously changed according to a position, a structure, and the like of the external connection terminal of the semiconductor device to be tested. The first circuit pattern 121 may be formed of a conductive metal such as Cu or Au, and the second circuit pattern 122 and the ground pattern 122a may be formed of nickel (Ni) or a nickel-cobalt alloy (Ni—Co) for connection and support with the vertical probe 1 and the connection film 5.

In the test socket according to the embodiment, a pitch between the external connection pad 114 and the external connection pad 114 adjacent thereto may be formed larger than a pitch between the contactor and the contactor adjacent thereto. That is, since the plurality of vertical probes 1 are formed with a pitch corresponding to the external connection terminals of the semiconductor device for realizing miniaturization and refinement, directly connecting the plurality of vertical probes 1 to the test board to perform the test may have restrictions. Accordingly, a more reliable test of the semiconductor device may be performed by rearranging the external connection pads 114 so that the external connection pads 114 have a larger pitch than the pitch between the contactors while corresponding to the electrode terminals of the test board.

The vertical probe 1 may be formed on the first surface 110a of the base layer 110 in plurality and formed of a conductive material using MEMS technology to be electrically connected to the circuit pattern portion 120 and the external connection terminals of the semiconductor device. The plurality of vertical probes 1 may be formed at regular or irregular intervals.

Each of the vertical probes 1 is composed of a contactor 2 electrically connected to the external connection terminal of the semiconductor device, and a shielding structure 3 electrically connected to the ground pattern and forming a predetermined space 4 by surrounding the contactor. The contactor 2 and the shielding structure 3 may be formed by laminating a conductive material using MEMS technology. When an electrically grounded shielding structure adjacent to each contactor forms a fence, it is possible to enhance the test reliability by restraining signal interference, noise, and distortion caused by high-frequency signals, specifically, in the test process, to ensure signal integrity.

The contactor 2 is provided with a connection pad 21 electrically connected to the second circuit pattern 122 of the base layer 110, a contact terminal 27 electrically connected to the external connection terminal of the semiconductor device, and a buffer portion electrically connected to the connection pad 21 thereunder and the contact terminal 27 thereon. The buffer portion may be formed in a spiral structure capable of buffering a downward pressure when the external connection terminal of the semiconductor device and the contactor are connected.

The buffer portion is provided with a first extending portion 26 formed to have a predetermined height in a Z-axis direction from a lower surface of the contact terminal 27, an eccentric extending portion 24 which is eccentric from the first extending portion 26 in the Z-axis direction and formed to have a predetermined height, a first connection beam 25 formed to be bent in a spiral direction at an XY plane so that one side is connected to a lower surface of the first extending portion 26 and the other side is connected to an upper surface of the eccentric extending portion 24, a second extending portion 22 formed to have a predetermined height in the Z-axis direction from an upper surface of the connection pad 21, and a second connection beam 23 formed to be bent at the XY plane in a spiral direction so that one side is connected to an upper surface of the second extending portion 22 and the other side is connected to a lower surface of the eccentric extending portion 24.

A plurality of contact tips 28 may be formed on the upper surface of the contact terminal 27 to allow physical or electrical contact of the external connection terminal of the semiconductor device to be tested. The contact tips 28 protrude from the upper surface of the contact terminal 27 with a conductive material. As the conductive material used for the contact tip 28, Ni, Ni—Co, and the like may be used to provide a stable function against external factors such as oxidation and the like. The shape and arrangement structure of the contact tip 28 may be variously changed according to a position and a structure of the external connection terminal of the semiconductor device to be tested.

The pitch between the plurality of vertical probes, that is, a distance D1 between the contactor and the contactor adjacent thereto, may be set in a range of 500 to 1000 μm. The height of the contactor of the vertical probe, that is, a distance D2 between the connection pad 21 and the contact tip 28 in the contactor may be set in a range of 450 to 700 μm. Further, a separation distance D3 of the space formed between the contactor and the shielding structure may be set to be narrower than 100 μm.

Each of the plurality of vertical probes is provided with the contactor 2 and the shielding structure 3 formed by laminating a conductive material on a contactor outer edge, and the plurality of shielding structures 3 are connected by the connection film 5.

The shielding structure 3 is formed in a coaxial structure in which circular bands are laminated. That is, in the shielding structure 3, a plurality of shielding layers 31, 32, 33, 34, 35, and 36 are sequentially laminated to form an empty circular pillar. Heights of the plurality of shielding layers may be different. The shielding structure 3 may be formed to have a height equal to or lower than the height of the contactor. The connection film 5 may be formed using MEMS technology in connection with the shielding structure 3 which is formed to be laminated. It is not necessary to specify the structure and shape of the shielding structure and the connection film, and the structure and shape may be variously changed depending on the position and structure of the external connection terminal of the semiconductor device to be tested.

The elastic layer 6 is formed so that the contactor 2 may be elastically supported by surrounding the contactor 2 in the space 4 of the shielding structure 3.

A material capable of imparting elasticity to the contactor so as to improve the connection reliability between the contactor 2 and the external connection terminal of the semiconductor device, for example, various synthetic rubbers and resins such as polydimethylsiloxane (PDMS), polyurethane (PU), polyurethane acrylate (PUA), silicone rubber, and polymethylmethacrylate (PMMA) may be used for the elastic layer 6. Accordingly, when the contactor and the external connection terminal of the semiconductor device come into contact with each other for the test, the test reliability may be enhanced by minimizing damage to the external connection terminal. That is, when the external connection terminal of the semiconductor device moved by an external pressure comes into contact with the contactor, since the external connection terminal comes into contact with the contact tip 28 of the contact terminal 27 and is elastically supported by the elastic layer 6, damage which may occur to the external connection terminal may be minimized.

The contactor 2 is hermetically formed by the elastic layer 6 rather than a part thereof. That is, the buffer portion of the contactor formed in the shielding structure 3 is sealed by the elastic layer 6, and the contact terminal 27 is exposed to the outside of the elastic layer 6 to be electrically connected to the external connection terminal of the semiconductor device. Further, the connection pad 21 may be exposed to the outside of the elastic layer 6 to be electrically connected to the second circuit pattern 122 of the base layer 110.

Figure 4A:
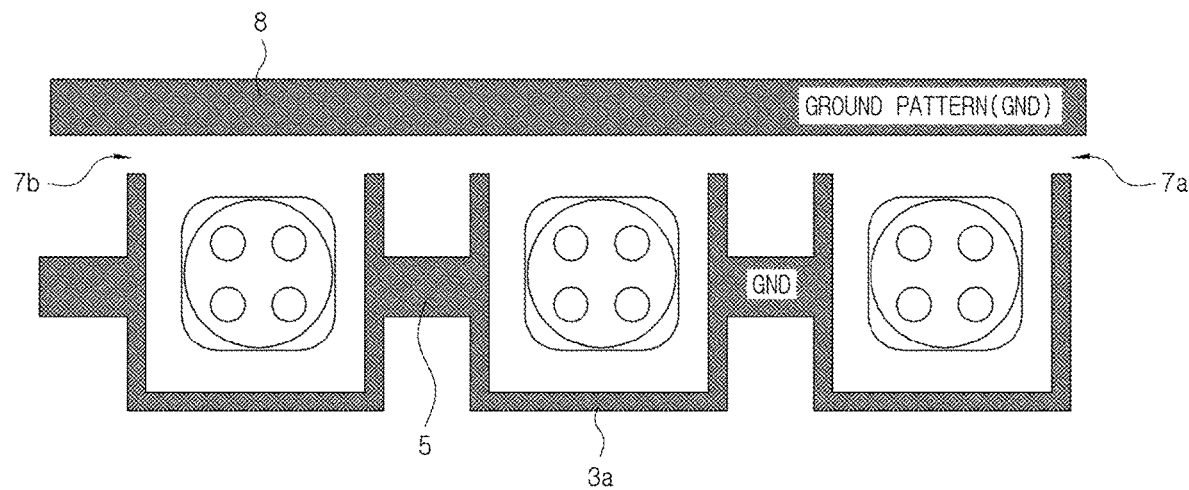
FIGS. 4A and 4B are plan views for describing an arrangement structure of the test socket according to the embodiment of the present invention.

Referring to FIG. 4A, a plurality of contactors 2 are disposed at a regular interval, and each contactor 2 is isolated by a shielding structure 3a. A shielding structure adjacent to the shielding structure is electrically connected by the connection film 5, and an auxiliary connection film 5a is formed so that the connection film 5 and a ground pattern (GND, 8) are electrically connected. The auxiliary connection film 5a may be formed of the same material as the connection film 5, that is, a conductive material. The auxiliary connection film 5a and the ground pattern (GND, 8) may be formed on the first surface 110a of the base layer 110 at the same height as the connection film 5.

At least one of the plurality of shielding structures 3a may be formed with an input part 7a which communicates with a space in which the contactor 2 is located. In the process of manufacturing the elastic layer 6 by injecting a liquid elastic layer material, when the liquid elastic layer material flows smoothly through the open input part 7a and fills up to an upper end of the connection film 5 and then overflows, the liquid elastic layer material flows into the space next to the adjacent contactor and thus a filling time to fill the space around the contactor of the test socket is reduced.

Figure 4B:
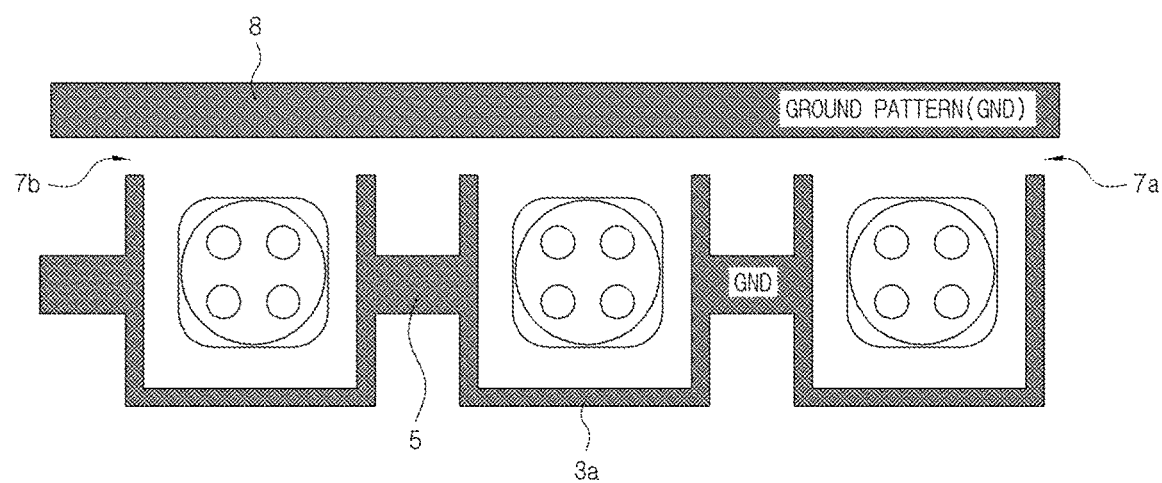

As shown in FIG. 4B, a plurality of input parts 7a and 7b are formed on both sides of the plurality of shielding structures 3a so that the liquid elastic layer material may be injected through various paths to further reduce a filling time of the elastic layer 6. In this case, the connection film 5 and the ground pattern 8 are separated at an upper portion of the base layer 110 and one side of the connection film 5 connected to the ground pattern 122a in the base layer 110 may be electrically connected to one side of the ground pattern 8.

Figure 5A:
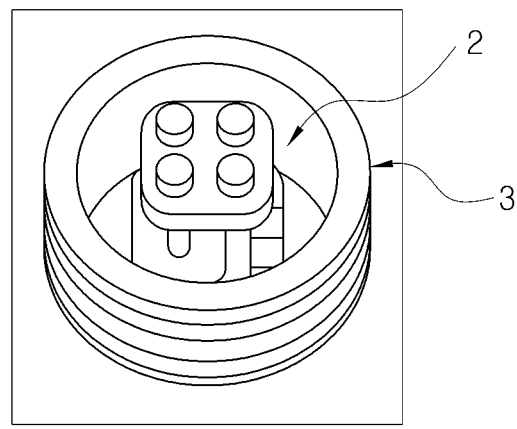
FIGS. 5A to 5D are photo images of a contactor and a shielding structure according to the embodiment of the present invention.
Figure 5B:
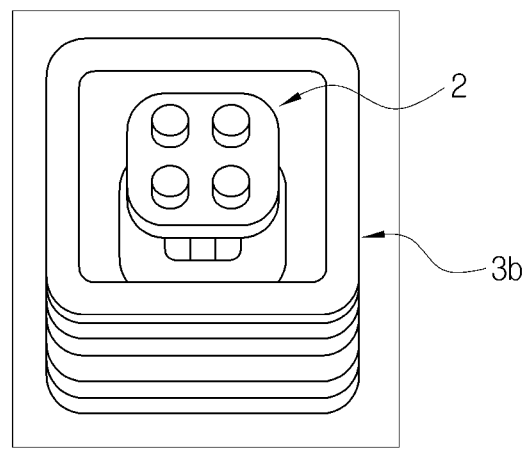

In FIG. 5A, the shielding structure 3 is formed in a circular cylinder-shaped coaxial structure, and in FIG. 5B, the shielding structure 3 is formed in a quadrangular cylinder-shaped coaxial structure, and structure cross-sectional shapes are different, but a method of manufacturing a coaxial structure by laminating layers upward is the same.

Figure 5C:
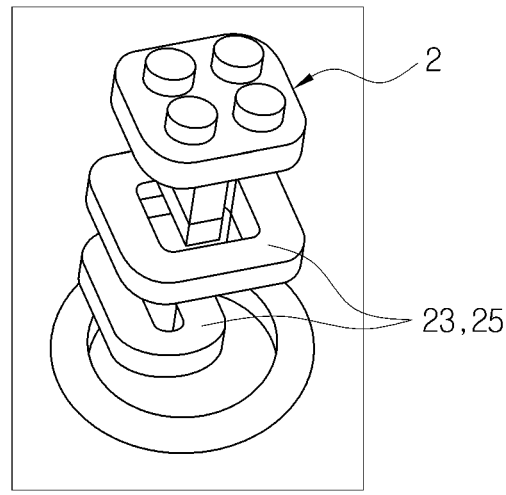
Figure 5D:
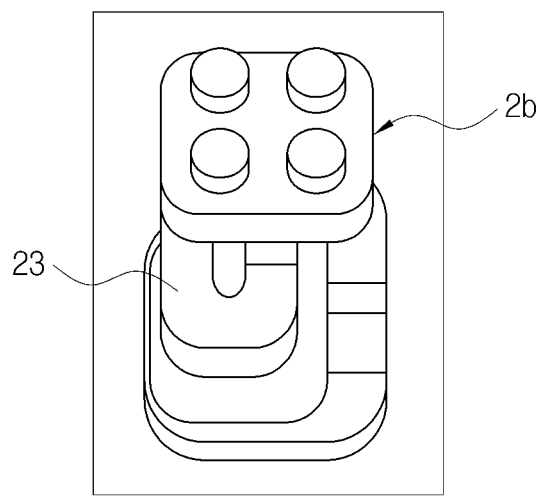

In FIG. 5C, the contactor 2 forms a buffer portion in a double stage, and thus the height of the contactor is high. and in FIG. 5D, the contactor 2 forms a buffer portion in a single stage, and thus the height of the contactor is low. A contactor having an appropriate height may be used according to the structure of the external connection terminal of the semiconductor device to be tested, and in the embodiment, the structure of the buffer portion of the contactor may be changed to respond.

Figure 6:
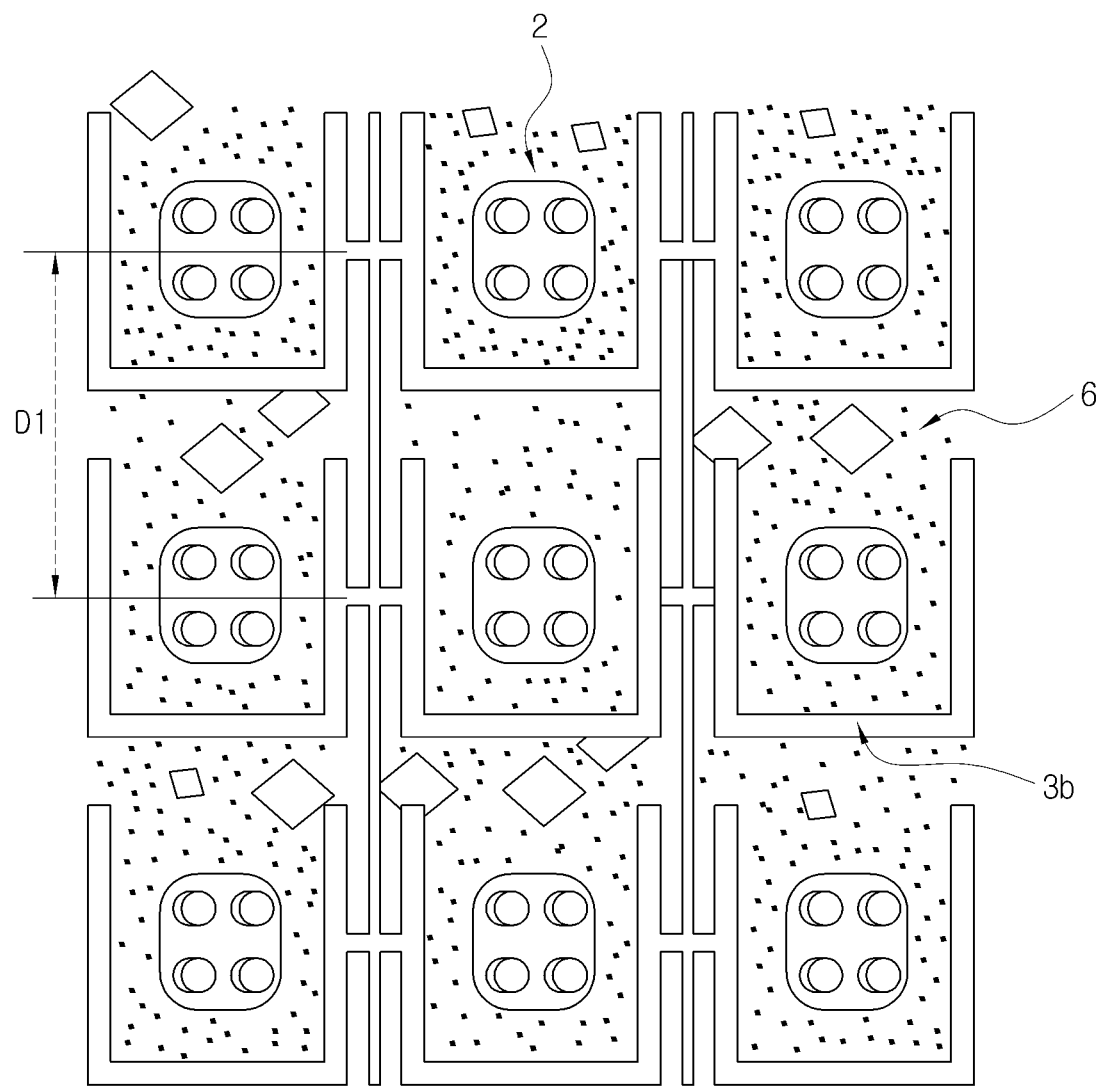
FIG. 6 is a photo image of a test socket manufactured using micro electro mechanical system (MEMS) technology according to the embodiment of the present invention.

FIG. 6 is a photo image of a test socket manufactured using micro electro mechanical system (MEMS) technology according to the embodiment of the present invention. The plurality of contactors 2 are disposed at a regular interval (D1) corresponding to the pitch of the external connection terminals of the semiconductor device, and each contactor 2 is isolated by the shielding structure 3b, and the elastic layer 6 cured after injecting a liquid elastic layer material is formed. The elastic layer 6 is filled in the space between the contactor 2 and the shielding structure 3a, and the contact terminal 27 of the contactor which electrically comes into contact with the external connection terminal of the semiconductor device is exposed to the outside.

FIGS. 7A to 7M are schematic views sequentially illustrating a process of manufacturing the probe and the shielding structure in a method of manufacturing the test socket according to the embodiment of the present invention.

Figure 7A:
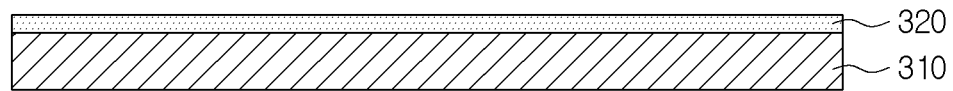
FIGS. 7A to 7M are schematic views sequentially illustrating a process of manufacturing the vertical probe and the shielding structure in a method of manufacturing the test socket according to the embodiment of the present invention.

As shown in FIG. 7A, in the present invention, a base substrate 310 is prepared, and a seed layer 320 is formed on the base substrate 310 using sputtering, electroplating, deposition (CVD), or the like. As the base substrate 310, an insulator substrate such as ceramic or glass may be used. In this case, a process of cleaning and drying a surface of the base substrate 310 to remove foreign substances and the like attached to the base substrate 310 may be further included.

The seed layer may be formed to a thickness of 1 to 2 μm. As a material of the seed layer, at least one of copper (Cu), titanium (Ti), and chromium (Cr) may be used. Characteristically, Ti/Cu or Cr/Cu may be used as the seed layer 320.

Figure 7B:
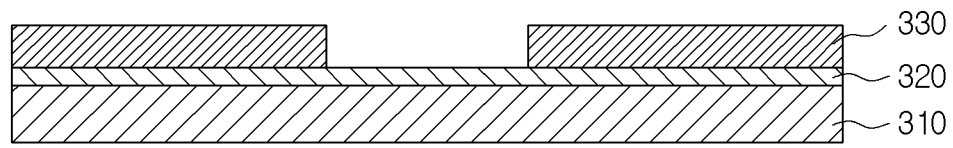

Subsequently, in the present invention, as shown in FIG. 7B, a first photo process is performed to form a connection pad 21 on the seed layer 320. More specifically, in the first photo process, a first photoresist 330 is applied on the seed layer 320, and the first photoresist at a center is removed with an etching solution using a mask to create a first center hole.

Figure 7C:
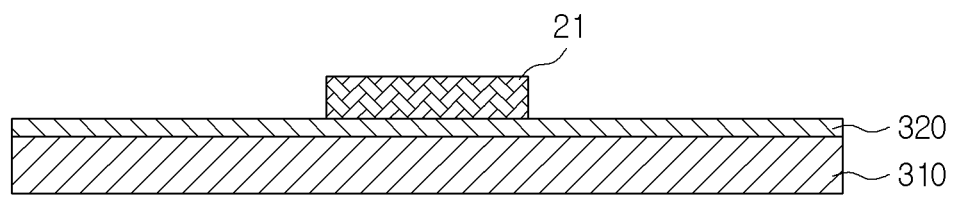

Further, in the present invention, as shown in FIG. 7C, the connection pad 21 is formed by depositing nickel (Ni) or the like in the first center hole through electroplating, and the first photoresist 330 remaining around the connection pad 21 is removed.

Figure 7D:
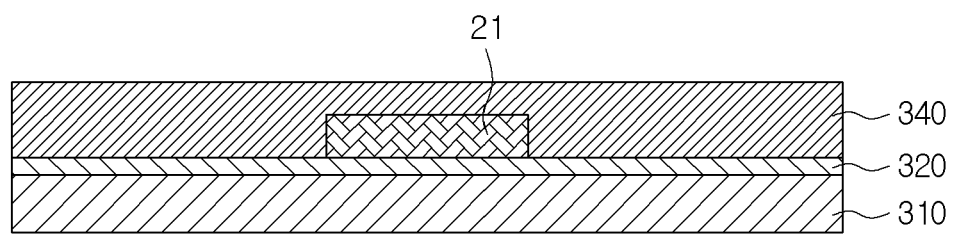

In addition, in the present invention, as shown in FIG. 7D, a blanket metal layer 340 is formed on the base substrate 310 and the connection pad 21. In this case, the blanket metal layer 340 is formed of copper or the like on the base substrate 310 and the connection pad 21 through electroplating.

Figure 7E:
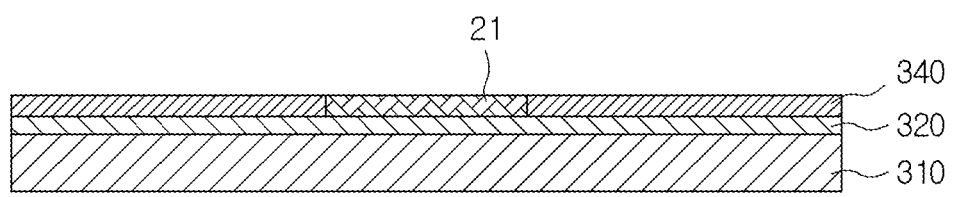

Subsequently, in the present invention, as shown in FIG. 7E, the blanket metal layer 340 formed on the connection pad 21 is removed through a planarization process. In this planarization process, the blanket metal layer 340 deposited on the base substrate 310 and the connection pad 21 are cut out through a lapping process so that the upper surface of the connection pad 21 is exposed.

Figure 7F:
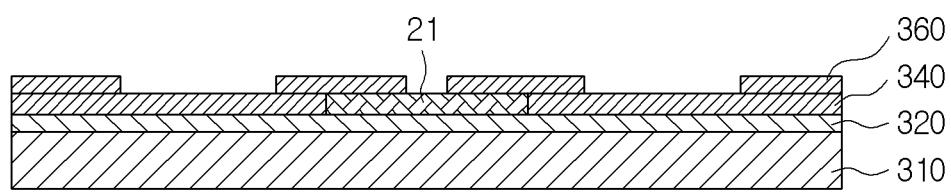

Further, as shown in FIG. 7F, a secondary photo process is performed on the blanket metal layer 340. More specifically, in the secondary photo process, a second photoresist 360 is applied on the blanket metal layer 340 to form a second center hole connected to the connection pad 21 and first and second neighboring holes located adjacent to the second center hole using a mask. Here, the first neighboring hole is for forming a shielding structure and the second neighboring hole is for forming a connection film.

Figure 7G:
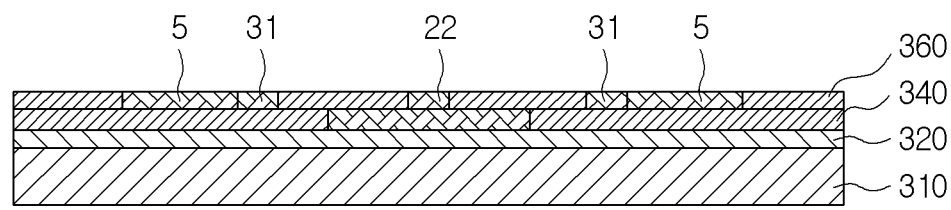
Figure 7H:
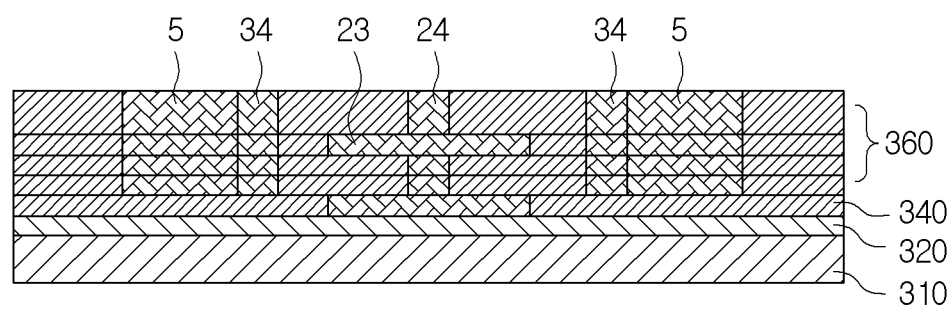

Subsequently, in the present invention, as shown in FIG. 7G and FIG. 7H, a second extending portion 22 of a contactor 2, a shielding layer 31 of a shielding structure 3, and a lower end portion of a connection film 5 are formed by depositing a conductive material such as nickel (Ni) through electroplating in the second center hole and the first and second neighboring holes. Further, a second connection beam 23 and an extending portion 24 are sequentially laminated on the second extending portion 22, upper shielding layers 32, 33, 34 are sequentially formed to be laminated on the shielding layer 31, and a process of growing the connection film 5 is performed. As necessary, in the operation, it is possible to smoothly polish through a process of removing an upper portion of the photoresist to a predetermined thickness, a process of generating a seed layer and removing a part of the seed layer, or a chemical mechanical polishing (CMP) process of an upper surface of the photoresist.

Figure 7I:
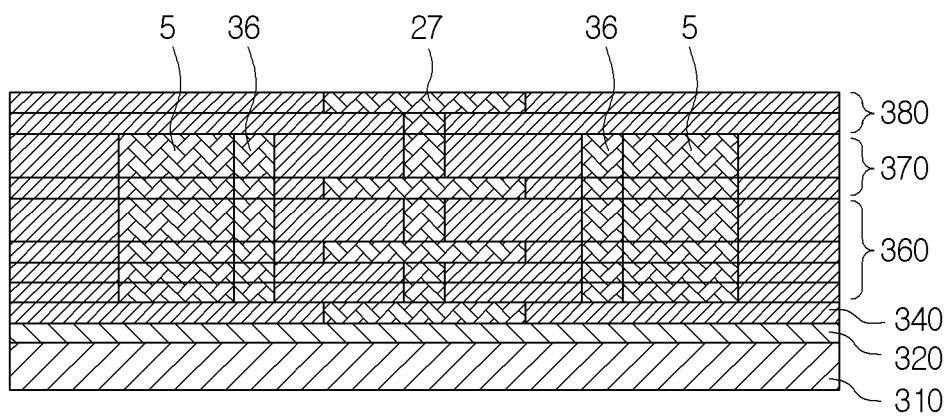

Further, in the present invention, as shown in FIG. 7I, a third photoresist 370 is applied, a conductive material such as nickel (Ni) is deposited through electroplating on an etched part using a mask to sequentially laminate a first connection beam 25 and a first extending portion 26 on the eccentric extending portion 24, upper shielding layers 35 and 36 are sequentially laminated on a shielding layer 34, and then the process of growing the connection film 5 is performed. Further, a fourth photoresist 380 is applied, and a conductive material such as nickel (Ni) is deposited through electroplating on an etched part using a mask to laminate a contact terminal 27 on the first extending portion 26. As necessary, the it is possible to smoothly polish through a process of removing an upper portion of the photoresist to a predetermined thickness, a process of generating a seed layer and removing a part of the seed layer, or a chemical mechanical polishing (CMP) process of an upper surface of the photoresist.

Figure 7J:
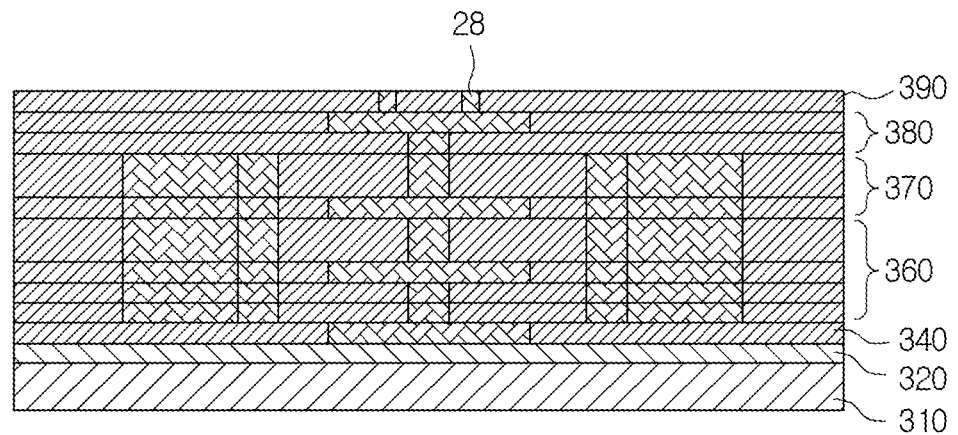

Further, in the present invention, as shown in FIG. 7J, a fifth photoresist 390 is applied, and a conductive material such as nickel (Ni) is deposited through electroplating on an etched part using a mask to laminate a contact tip 28 on the contact terminal 27.

Figure 7K:
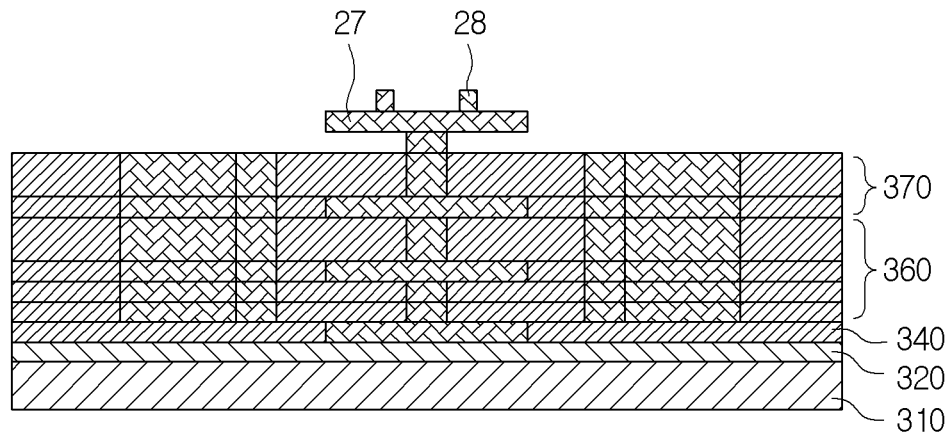
Figure 7L:
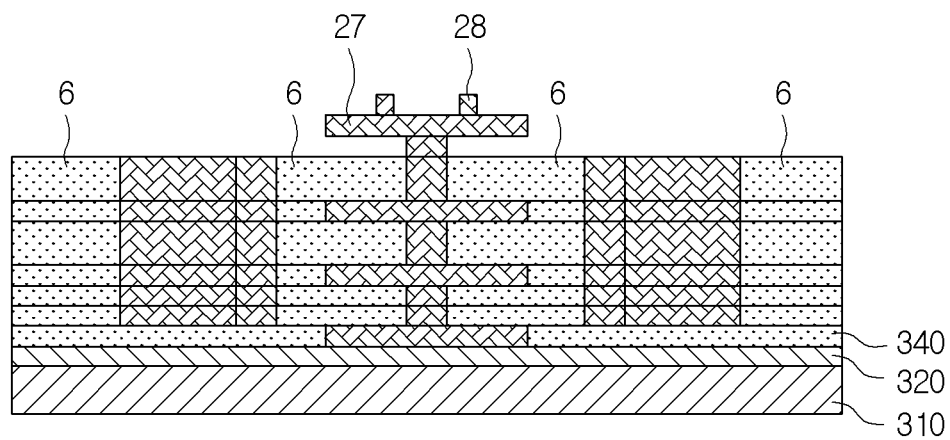

In addition, in the present invention, an elastic layer 6 is formed by injecting and curing a material capable of imparting an elastic force, for example, liquid PDMS or the like in positions where the fourth and fifth photoresists 380 and 390 are removed as shown in FIG. 7K, and the second and third photoresists 360 and 370 are removed as shown in FIG. 7L. The elastic layer 6 is filled in a space 4 between the contactor 2 and the shielding structure 3 to stably and elastically support the contactor and the shielding structure.

Figure 7M:
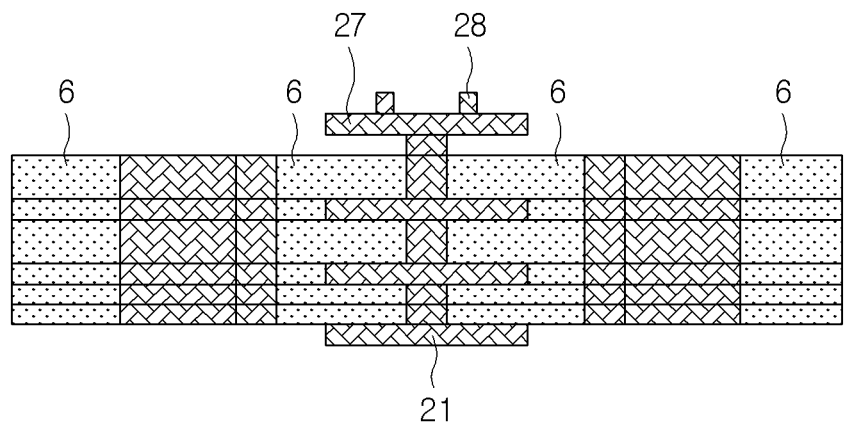

Finally, in the present invention, as shown in FIG. 7M, the manufacture of the contactor 2, the shielding structure 3, and the connection film 5 is completed by removing the seed layer 320.

In the test socket manufactured like the above, since signal interference, noise, and distortion are restrained to enhance the test reliability by forming a coaxial shielding structure with a conductive material on each contactor, and the elastic layer is filled in the space between the contactor and the shielding structure to surround each contactor, it is possible to restrain shape deformation of the contactor due to a decrease in elasticity of the elastic layer and improve durability of the contactor.

The above descriptions of the present invention are exemplary, and those skilled in the art may understand that modification to other specific forms without changing the technical spirit or essential characteristic of the present invention may be easily performed.

That is, it should be understood that all of the above-described embodiments are exemplary and are not limited. For example, each component described as a single type may be implemented in a distributed manner, and similarly, components described as being distributed may also be implemented in a combined form.

All changes and modifications derived from the mean and scope of the claims and the equivalent should be understood as being included in the scope of the present invention.

The invention claimed is:

1. A semiconductor device test socket comprising:
a plurality of vertical probes each including a contactor having a contact terminal electrically connected to an external connection terminal of a semiconductor device, and a shielding structure which is formed by sequentially laminating a conductive material on an outer edge of the contactor in a coaxial structure using micro an electro mechanical system (MEMS) technology and is electrically connected to a ground;
a connection film which is formed by sequentially laminating a conductive material using the MEMS technology to electrically connect the shielding structures of the plurality of vertical probes formed with a pitch corresponding to the external connection terminal of the semiconductor device; and
an elastic layer which is filled in a space between the contactor and the shielding structure so that the contact terminal of the contactor is exposed after forming the contactor, the shielding structure, and the connection film,
wherein the contactor includes a connection pad formed at a position corresponding to the contact terminal, and a spiral shaped buffer portion configured to connect the contact terminal and the connection pad, and
the buffer portion includes at least one extending portion formed in a Z-axis direction using the MEMS technology, and at least one connection beam formed to be bent in a spiral direction at an XY plane.

2. The semiconductor device test socket of claim 1, wherein the plurality of shielding structures are formed in a coaxial structure of which a cross-section has a circular shape or a quadrangular shape.

3. The semiconductor device test socket of claim 1, wherein the plurality of shielding structures are formed to have a height which is the same as the contactor.

4. The semiconductor device test socket of claim 1, wherein the plurality of shielding structures are formed to be lower than a height of the contactor.

5. The semiconductor device test socket of claim 1, wherein the plurality of shielding structures and the connection film are made of nickel or a nickel-cobalt alloy as a conductive material.

6. The semiconductor device test socket of claim 1, wherein an input part opened to inject a liquid elastic layer material is formed in at least one shielding structure among the shielding structures of the plurality of vertical probes.

7. The semiconductor device test socket of claim 1, wherein:
a pitch between the plurality of vertical probes ranges from 500 to 1000 μm;
a height of the contactor of each of the vertical probes ranges from 450 to 700 μm; and
a separation distance of the space formed between the contactor and the shielding structure is smaller than 100 μm.

8. The semiconductor device test socket of claim 1, wherein the at least one extending portion includes a first extending portion formed to a predetermined length in the Z-axis direction from a lower surface of the contact terminal, and an eccentric extending portion which is eccentric from the first extending portion in the Z-axis direction and formed to a predetermined height,
wherein the at least one connection beam includes a first connection beam formed to be bent in the spiral direction at the XY plane so that one side is connected to a lower surface of the first extending portion and the other side is connected to an upper surface of the eccentric extending portion,
wherein the at least one extending portion further includes a second extending portion formed to a predetermined height in the Z-axis direction from an upper surface of the connection pad, and
wherein the at least one connection beam further includes a second connection beam formed to be bent in the spiral direction at the XY plane so that one side is connected to an upper surface of the second extending portion and the other side is connected to a lower surface of the eccentric extending portion.

9. The semiconductor device test socket of claim 1, wherein:
a plurality of contact tips are formed to protrude from an upper surface of the contact terminal; and
each of the plurality of contact tips has a circular cross-section and is formed of a conductive material.

10. The semiconductor device test socket of claim 1, wherein a material of the elastic layer includes any one of polydimethylsiloxane (PDMS), polyurethane (PU), polyurethane acrylate (PUA), silicone rubber, and polymethylmethacrylate (PMMA).

11. The semiconductor device test socket of claim 1, wherein:
the plurality of vertical probes are formed on a first surface of a base layer mounted on a test board electrically connected to semiconductor inspection equipment; and
the base layer is formed of polyimide (PI).

12. The semiconductor device test socket of claim 11, wherein:
a plurality of external connection pads are formed on a second surface of the base layer;
a circuit pattern portion made of a conductive material is formed in the base layer; and
the plurality of external connection pads electrically connect the circuit pattern portion and an electrode terminal of the test board.

13. The semiconductor device test socket of claim 12, wherein the plurality of external connection pads are formed at regular intervals.

14. The semiconductor device test socket of claim 12, wherein the plurality of external connection pads are formed at irregular intervals.

15. The semiconductor device test socket of claim 12, wherein the circuit pattern portion includes a first circuit pattern formed in the base layer to be electrically connected to the external connection pad, a second circuit pattern having one end electrically connected to the first circuit pattern and the other end exposed on the base layer to be electrically connected to one of the vertical probe and the connection film, and a ground pattern.

16. The semiconductor device test socket of claim 15, wherein the second circuit pattern and the ground pattern are formed of nickel or a nickel-cobalt alloy.

17. The semiconductor device test socket of claim 12, wherein a pitch between the one external connection pad and an external connection pad adjacent thereto is formed larger than a pitch between the contactor and a contactor adjacent thereto.

18. The semiconductor device test socket of claim 11, wherein:

an auxiliary connection film and a ground pattern are formed in the first surface of the base layer to have a height the same as the connection film; and the auxiliary connection film electrically connects the connection film and the ground pattern.

19. The semiconductor device test socket of claim 1, wherein the buffer portion includes one extending portion and one connection beam and is formed as a single stage.

20. The semiconductor device test socket of claim 1, wherein the buffer portion includes two extending portions and two connection beams and is formed as a double stage.

* * * * *